United States Patent
Kobayashi

[11] Patent Number: 5,852,556
[45] Date of Patent: Dec. 22, 1998

[54] POWER CONVERTER

[75] Inventor: Sumio Kobayashi, Tokyo, Japan

[73] Assignee: Kabushiki Kaisha Toshiba, Kawasaki, Japan

[21] Appl. No.: 817,163

[22] PCT Filed: Aug. 19, 1996

[86] PCT No.: PCT/JP96/02315

§ 371 Date: Apr. 17, 1997

§ 102(e) Date: Apr. 17, 1997

[87] PCT Pub. No.: WO97/07588

PCT Pub. Date: Feb. 27, 1997

[30] Foreign Application Priority Data

Aug. 18, 1995 [JP] Japan ................................. 7-210315

[51] Int. Cl.$^6$ ........................................... H02M 7/04
[52] U.S. Cl. .......................... 363/85; 363/54; 363/128
[58] Field of Search .............................. 363/84, 85, 52, 363/54, 128, 96

[56] References Cited

U.S. PATENT DOCUMENTS

| | | | |
|---|---|---|---|
| 3,838,332 | 9/1974 | Hopengarten | 363/85 |
| 4,547,843 | 10/1985 | Hucker | 363/67 |
| 4,868,731 | 9/1989 | Hobi | 363/54 |
| 5,155,673 | 10/1992 | Takahashi et al. | 363/54 |

FOREIGN PATENT DOCUMENTS

| | | |
|---|---|---|
| 49-107661 | 10/1974 | Japan . |
| 53-68558 | 6/1978 | Japan . |

OTHER PUBLICATIONS

T. Takahashi, et al., IPEC–Tokyo, pp. 1268–1272, Apr. 2–6, 1990, "The Thyristor Valve Design Considering The Critical Dynamic Conditions".

*Primary Examiner*—Adolf Berhane
*Attorney, Agent, or Firm*—Oblon, Spivak, McClelland, Maier & Neustadt, P.C.

[57] ABSTRACT

A power converter comprises a pulse generator capable of outputting two different levels of gate power. A thyristor (LTT) is turned on by the first gate power output from the pulse generator, and the second gate power is supplied to the thyristor (LTT) during the transient period from the time the thyristor valve current is cut off to the time the withstand voltage of the thyristor (LTT) recovers to the rated value. The second gate power is set at a low level by which the thyristor (LTT) will not be turned on when the second gate power with the normal level of voltage is applied to the thyristor.

15 Claims, 3 Drawing Sheets

POWER CONVERTER

TECHNICAL FIELD

This invention relates to a power converter for converting an alternating current to a direct current, or vice versa.

BACKGROUND ART

FIG. 2 shows a conventional power converter comprising a thyristor valve and a controller for controlling the thyristor valve. As shown in FIG. 2, the thyristor valve has a plurality of light-triggered thyristor (hereinafter referred to as "thyristor") LLT which are connected in series. The thyristor is used as a switching element, which allows an electric current to flow in only one direction. In order to equalize the voltages applied to the thyristors of the thyristor valve, one voltage divider is connected in parallel to each thyristor. The voltage divider is a serial circuit being consisted of a capacitor C and a resistor R. Two reactors L are connected to the ends of the serial circuit of the thyristor LTT.

They control the current flowing into each thyristor LTT. The Reactors L also alleviate the rising curve of a surge voltage VS applied from the outside to the thyristors LTTs when the surge voltage VS is applied to the thyristor LTT.

Each thyristor LTT is connected in parallel with light emitting diodes LEDF and LEDR. The diode LEDF emits light when a forward bias voltage is applied to the thyristor LTT, and the diode LEDR emits light when a reverse voltage is applied to the thyristor LTT. The currents flowing into the light-emitting diodes LEDF and LEDR are controlled by a resistor RD. The light beams emitted from the LEDF and LEDR are transmitted through light guides LGs to a pulse generator PG which is set at a ground potential.

The pulse generator PG comprises a light-electric converter LEC for converting the light signals transmitted from the light emitting diodes LEDF and LEDR into a forward voltage signal FV and a backward voltage signal RV. The forward voltage signal FV and reverse voltage signal RV are used to determine a timing when the pulse generator generates a pulse to control the gate of the thyristor LTT.

The pulse generator PG includes serially connected light emitting diodes LEDs in the same number as the thyristors LTTs. The serial circuit of the light emitting diodes LEDs is connected to a power source E through a switching element S1 and an impedance Z1 in series.

Turning on the switching device S1, current I1 flows to the LEDs connected to the switching device S1, in series whereby each LEDs simultaneously emit light. Each light emitted from the light emitting diodes LEDs is applied to one of the gates of the thyristors LTTs through the light guides LGs. In short, when the switching device S1 is turned on, the serially connected thyristors LTTs can be simultaneously turned on. LG1 is a logic circuit for controlling the switching device S1, AMP1 is an amplifier for outputting an ON/OFF signal for turning on and off the switching device S1, upon receipt of the output of the logic circuit LG1.

The thyristor valve has an arrester Ar. The arrester Ar controls the level of a surge voltage VS applied externally to coordinate with the withstand voltage of the thyristor LTT (abbreviated VDRM).

FIG. 3 shows a timing chart representing the relationship between the waveforms of voltage and currents and the gate pulse. FIG. 3 is prepared to explain the feature of the present invention, but is used here to explain the conventional art. The timing chart shows the waveforms comprising the thyristor valves of FIG. 2 which are bridged in a three-phase system and operated as an inverter.

AA describes the voltage between the terminals of the thyristors LTTs, and IT describes a thyristor valve current. BB describes a transient withstand voltage during the period between the time that the thyristor valve current IT is cut off and the time that the forward withstand voltage BB reaches the rated value VDRM.

The thyristors LTTS are turned off in a reverse voltage period T1 between the time that the thyristor valve current IT is cut off and the time that the voltage AA recovers to the forward voltage. In general, the reverse voltage period T1 is set at a value equal to a sum of a turning-off time of the thyristors LTTs and some extra time. After the thyristors LTTs are turned off, the forward withstand voltage BB of the thyristors LTTs starts to recover.

To completely recover the forward withstand voltage of the thyristors LTTs so that the thyristors LTTs may withstand an external voltage equal to the rated value VDRM, a predetermined period TFP is required. In a normal operation, the transient withstand voltage BB of the thyristors remains lower than AA, AA>BB, and no problem will occur.

However, if an over-voltage higher than the transient withstand voltage BB is applied to the thyristors LTTs during the predetermined period TFP, the thyristors LTTs cannot withstand the over-voltage, and may be broken down.

PHS describes a gate pulse instruction signal input from a controller (not shown) to the logic circuit LG1 of the pulse generator PG. The logic circuit LG1 turns the switching device S1 on, when the AND condition of the gate pulse instruction signal PHS and the forward voltage signal FV is satisfied.

As shown in FIG. 3, the AND condition of the gate pulse instruction signal PHS and the forward voltage signal FV is satisfied at the time $t_0$, and then the current I1 flows. The light emitting diodes LEDs supplied with the current I1 emit the light beams. The light beams are applied to the gates of the thyristors LTTs simultaneously. And then the thyristors LTTs are thereby turned on, and the thyristor valve current IT flows.

If the surge voltage VS1 is larger than the transient withstand voltage BB, and the surge voltage VS1 is applied to the thyristors LTTs during the period T1 starting from the time the current IT is cut off, the thyristors LTTs cannot withstand the over-voltage and they may be broken down.

In the prior art, in order to protect the thyristor valve, when the surge voltage VS1 is applied to the thyristors LTTs during the period T1, the AND condition of the gate pulse instruction signal PHS and the forward voltage signal FV is satisfied at the time t1 that the surge voltage VS1 is generated. More specifically, so that all light emitting diodes LEDs emit the light beams simultaneously and protection gate power is supplied to all thyristors LTTS, all thyristors LTTs are turned on. However, if the surge voltage VS2 is generated during a period T2, the thyristors LTTs cannot be turned on by the protection gate power. It is very troublesome to supply the protection gate power to the thyristors LTTs during a period T2 for the reason described below. In practice, the devices currently distributed are not designed to perform this operation.

During a period T2, the terminal voltage (a thyristor voltage) AA applied to the thyristors LTTs is set as a forward voltage. Accordingly, when the gate power is applied to the thyristor LTT during a period T2, the thyristor is turned on and the normal operation cannot be performed.

In order to protect the thyristors LTT, from the surge voltage VS2, the protection gate power required to input to all thyristors LTTs is based on the following condition being satisfied:

VS2>AA+ΔAA, where VS2 is a surge voltage and ΔAA is a surplus voltage.

In this time, the thyristors LTTs cannot be protected unless the ΔAA is set to satisfy the condition AA+ΔAA<BB (BB is the transient withstand voltage of the thyristors LTTS). The transient withstand voltage BB varies in accordance with the property of the respective thyristors LTTs. It is therefore necessary for respective thyristors LTTs to arrange a determining means for determining whether or not the protection gate power should be input. Especially, in light-direct-triggered thyristors, the pulse generator PG arranged on the ground potential side are directly connected to the gates of the thyristors arranged at the high potential side by the light guides LGs. Thus, electronic circuits do not need to be provided at the gate portion of the thyristors arranged at the high potential side. In short, the thyristor valve is advantageous in the simple structure and high reliability by virtue of this constitution that no electronic circuits are necessary. Accordingly, if the thyristor has a complicated protection component or circuit, it will fail to acquire the advantage of the light-direct-triggered thyristors. It has been tried in vain to design a thyristor which can protect itself against the forward voltage externally applied to the thyristors during the period T2.

During a period T3, the forward withstand voltage of the thyristors LTTs recovers to the rated value of VDRM. Thus, the thyristors do not need to have any protection component or circuit, if the forward withstand voltage coorporates with the protection level of the arrester Ar. It is thus very difficult, in practice, to protect the light-direct-triggered thyristor against the forward voltage externally applied to the thyristors during the period T2.

A forward voltage higher than the forward withstand voltage may be applied to the thyristor during the transient period between the time that the thyristor valve current generated by the thyristors LTTs is cut off and the time that the forward withstand voltage recovers to the rated value. In this case, the thyristors LTTs cannot withstand the applied voltage, and will be turned on again. This phenomenon can be explained as described below.

Even after the thyristors are turned off, carriers are left in the junction portion of each of the thyristors. The remaining carriers recombine with holes, and gradually vanish. The forward withstand voltage of the thyristor is in a reverse ratio to the amount of the remaining carriers. Once all remaining carriers vanish, the thyristor can withstand the voltage equal to the rated withstand voltage. The remaining carriers are randombly distributed in a junction face. When the over-voltage is applied to the thyristor, the thyristor is turned on, first at the portion having the lowest withstand voltage (i.e., the portion in which most of the remaining carriers exist). At this time, the thyristor will be heated only at the conductive portion firstly turned on and may be broken down, if a sufficient amount of the carriers to make the entire part of the thyristor turn on are not supplied thereafter.

SUMMARY OF THE INVENTION

The object of the present invention is therefore to provide a power converter for converting alternating current to direct current, or vice versa, without damaging the thyristors LTTs even if a forward voltage exceeding the withstand voltage of the thyristors is applied to the thyristors during a transient period between the time that the thyristor valve current generated by the thyristors LTTs is cut off and the time that the forward withstand voltage recovers to the rated value.

The converter of the present invention comprises the pulse generator capable of outputting two different levels of gate powers. The thyristors LTTs are turned on by a first gate power output from the pulse generator. A second gate power continues to be supplied to the thyristors LTTs during the transient period from the time that the thyristor valve current is cut off to the time that the withstand voltage of the thyristors LTTs recovers to the rated value. The second gate power is set at a low level by which the thyristor LTT will not be turned on unless the second gate power with a normal voltage is applied. By setting the level of the second gate power at such a level, a small amount of carriers can exist in the gate during the transient period, and the portion having the lowest level of forward withstand voltage on the junction face functions as a gate of the thyristor. When the thyristor LTT constituted as above is applied with the excess forward bias voltage, the thyristor LTT turns on firstly at the gate. Since the thyristor LTT turns on firstly at the gate, the amount of carriers are increased by the amplification function of a gate current. Accordingly, the entire part of the thyristor LTT is safely turned into the conductive state, and the thyristor LTT will not be damaged.

If the second gate power is too large, the thyristor LTT turns on by the normal impressed voltage, and thus the normal operation of the device is prevented. In contrast, if the second gate power is too small, it's difficult for the thyrsistor LTT to protect from the over-voltage. Therefore, it is the most effective to set the second gate power at the level of 1–10% of a minimum gate trigger power.

The period that the second gate power is supplied is set longer than the turn-off period of the thyristor LTT. By setting the second gate power supplying period in this manner, the rated forward withstand voltage of the thyristor LTT can recover immediately after the second gate power is turned off.

After the thyristor valve current is cut off, the reverse voltage between the terminals of the thyristor LTT is detected, and the period that the second gate power is supplied is set from the time of the detection. By setting the period that the second gate power is supplied in this manner, the second gate power can be supplied with reliability in the period that the transient forward withstand voltage of the thyristor recovers.

Further, the converter of the present invention is provided with two electronic switches to control the current flowing to the device as a light source such as a light emitting diode for supplying the power to the thyristor LTT. By turning the first switch on, the first gate power is generated, and the second gate power is generated by turning the second switch on. By generating the first and second gate powers with use of one light source in this manner, the thyristor valve with a simple structure and high reliability can be obtained.

When a forward voltage is applied to the thyristor LTT of the present invention in an early stage (i.e., the period T1 indicated in FIG. 3) of the recovering period of the forward withstand voltage of the thyristor, the first gate power is interruptedly supplied to the thyristor irrelevant of the level of the applied forward voltage. Accordingly, the protection of the thyristor can be improved.

This is because, at the early stage (T1) of the recovering period of the forward withstand voltage of the thyristor, a large amount of the remaining carriers exist, and the withstand voltage in the portion other than the gate is low. In this condition, the ON phenomenon may easily occur in the portion other than the gate. It is therefore more safe for the thyristor to be supplied with the first gate power in order to ensure to turn on the gate at first such that the portion other than the gate does not turn on.

The recovering period of the forward withstand voltage of the thyristor depends on the thyristor valve current and junction temperature. As the amount of the thyristor valve current and the junction temperature increase, the recovering period is lengthened. Accordingly, by setting the protection period that the second gate power continues to be input longer, the thyristor valve having the protection with high reliability can be obtained.

BEST MODE OF CARRYING OUT THE INVENTION

This invention can be more fully understood from the following detailed description when taken in conjunction with the accompanying drawings.

Figure 1:
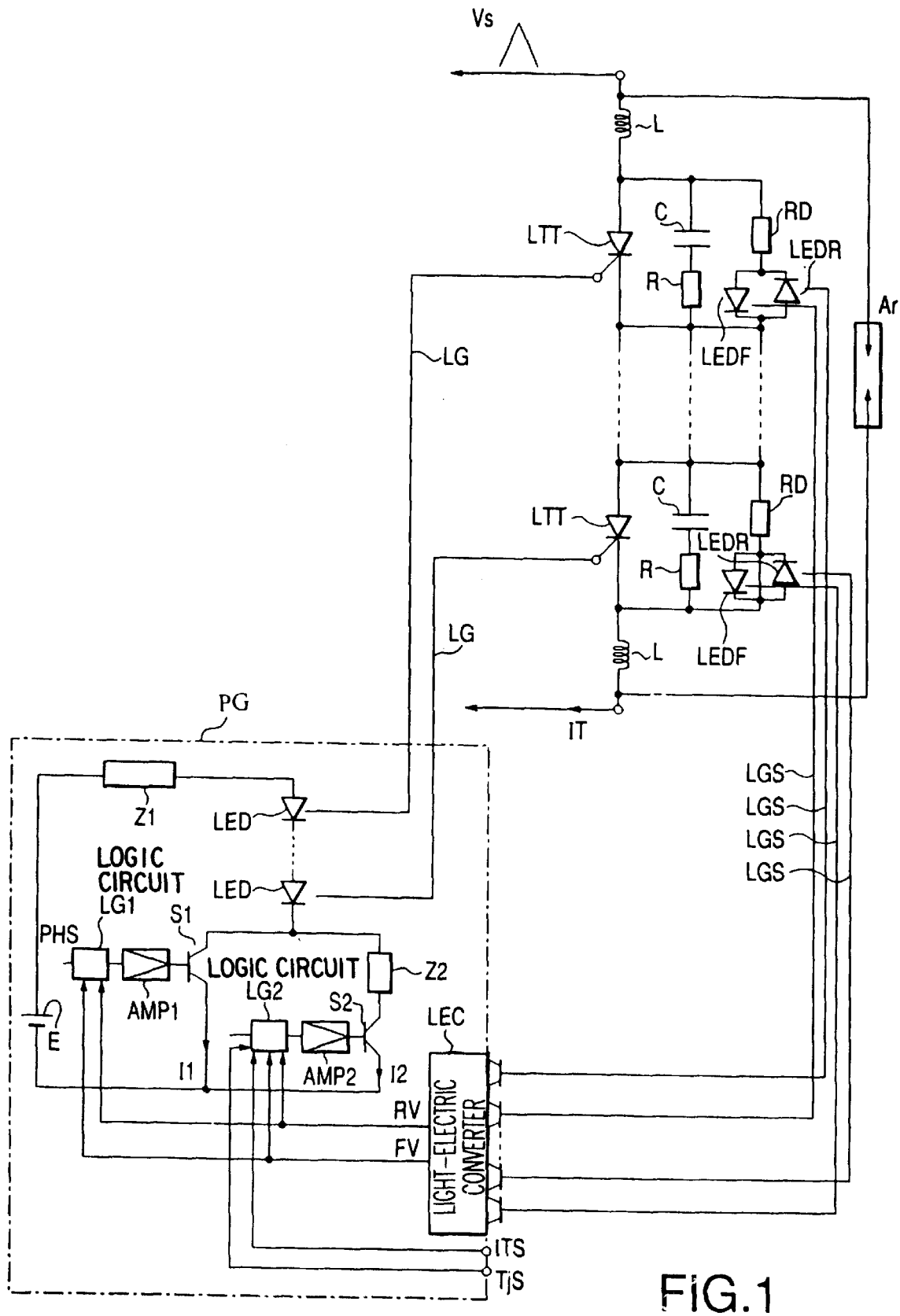
FIG. 1 is a block diagram of the power converter of the present invention, comprising a controller of a thyristor valve.
Figure 2:
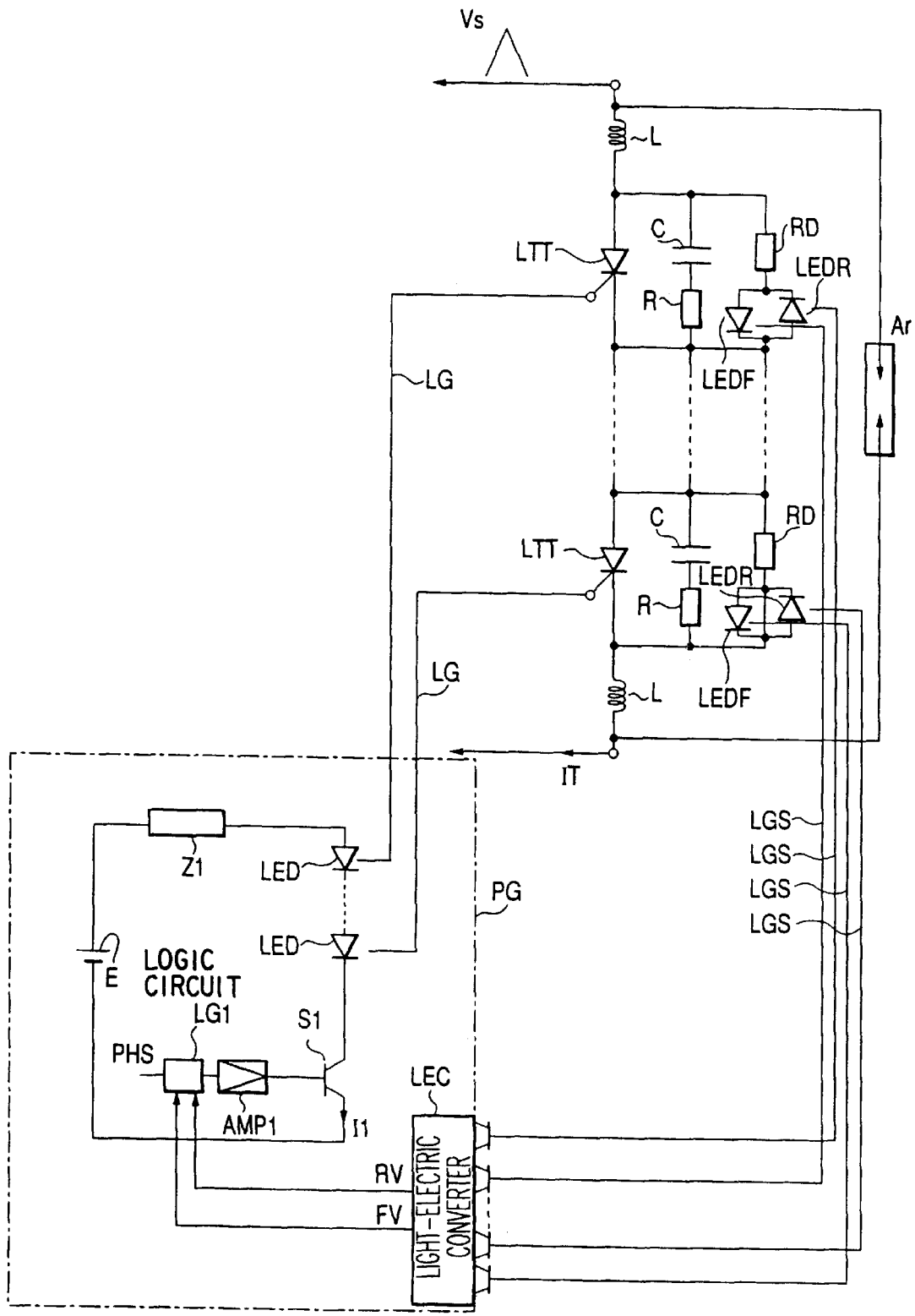
FIG. 2 is a block diagram of the conventional power converter.

FIG. 1 shows the constitution of the power converter according to present invention. The same reference numerals are used in FIGS. 1 and 2 to designate the portions having the same functions.

In FIG. 1, a pulse generator PG is arranged at the ground potential and supplies a light gate pulse to light-direct-triggered thyristors. The serial circuit of light emitting diodes LEDs as light sources supplies the light gate power to the thyristors corresponding to connection/disconnection to a power source E by the switching devices S1 and S2 to flow currents I1 and I2, respectively. Impedances Z1 and Z2 determine the values of the currents I1 and I2, respectively. Logic circuits LG1 and LG2 operate the switching devices S1 and S2, respectively. Amplifiers AMP1 and AMP2 amplify the signals output from the logic circuits LG1 and LG2, respectively. The switching devices S1 and S2 are driven by the output signals of the logic circuit LG1 and LG2.

Forward voltage signal FV and reverse voltage signal RV, show that the thyristor LTT is applied with the forward bias voltage and reverse voltage respectively. Their signals FV and RV are input to the logic circuits LG1 and LG2 in order to determine the driving conditions of the switching devices S1 and S2, respectively.

Figure 3:
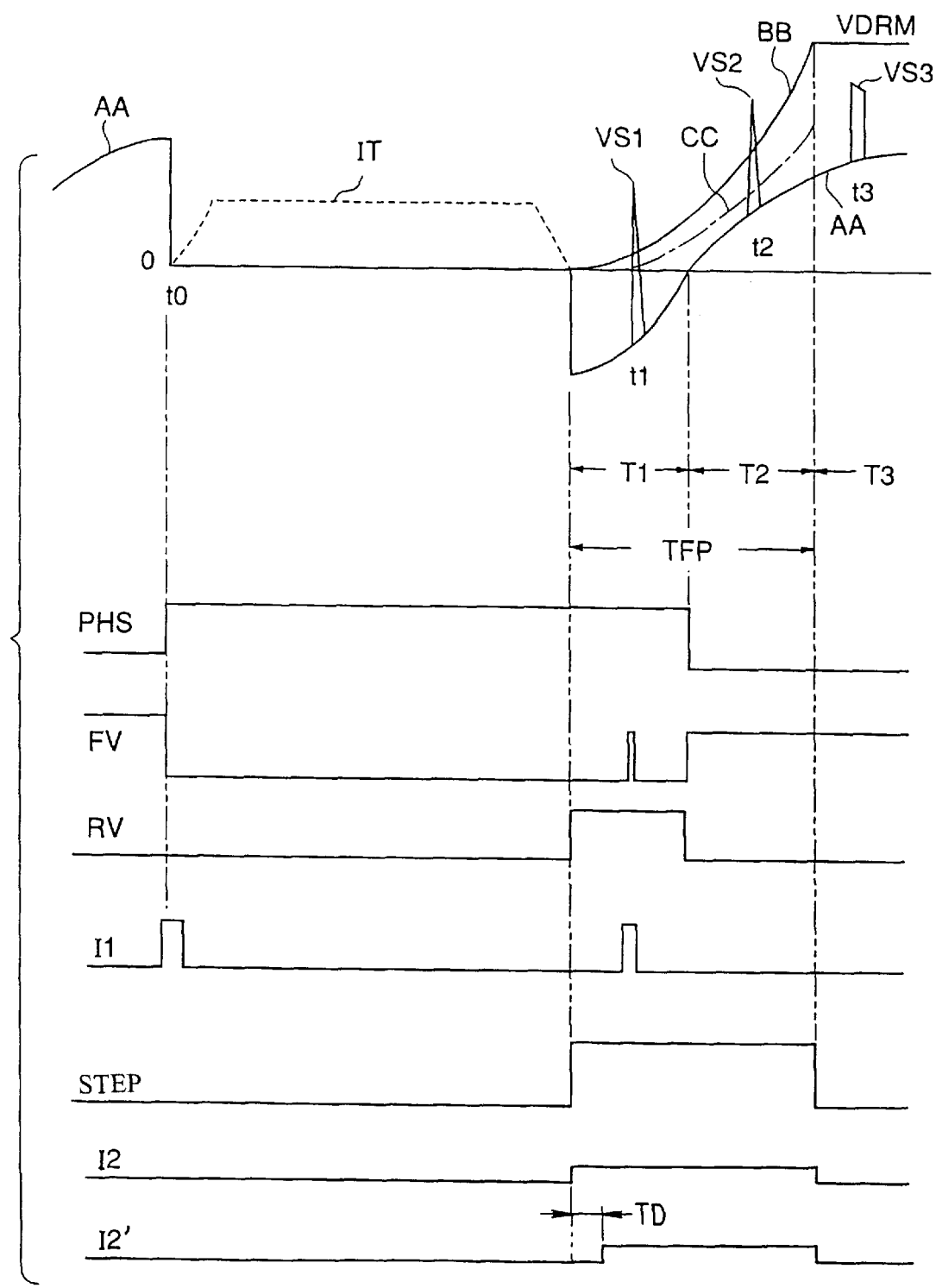
FIG. 3 is a timing chart showing the relationship between the waveforms of the voltage and currents and a gate pulse during the operation of the power converter of the present invention.

FIG. 3 shows the relationship between the waveforms of the voltage and currents and the gate pulse, as the main feature of the present invention during the operation of the power converter. When the thyristor valve current IT flowing to the thyristors LTTs is cut off and the thyristors LTTs are applied with a reverse voltage, light emitting diodes LEDs emit light. Accordingly, when the thyristors LTTs are applied with a reverse voltage, the reverse voltage signals RVs are input to the logic circuits LG1 and LG2 via a light-electric converter LEC.

In the logic circuit LG2, as shown in FIG. 3, the reverse voltage signal RV continues to be output until a protection period determining signal STEP is output. The protection period determining signal STEP is amplified by the amplifier AMP2 and turns the switching device S2 on to flow the current I2 to the light emitting devices LEDs. The current I2 is limited at a rather low level compared to the current I1 by the impedance Z2, and thus a desired low level of the light gate power can be supplied to each of the thyristors LTTs only during a period TPF.

In FIG. 3, CC indicated by a broken line shows a waveform of a forward withstand voltage of each of the thyristors LTTs when the current I2 is supplied to the light emitting diodes LEDs and the second gate power is supplied to the thyristors LTTS. The forward withstand voltage CC becomes lower than the forward withstand voltage BB which is the withstand voltage of the thyristors LTTs when the second gate power is not supplied to the thyristors LTTs. This is because, when the lower gate power is supplied to the thyristors LTTs, the level of the withstand voltage at each of the gates is lowered.

The forward withstand voltage CC of the thyristors LTTs when the second gate power is supplied to the thyristors LTTs is set such that each of the thyristors LTTs is turned on firstly at the gate when the external surge voltage exceeds the forward withstand voltage CC. Since the gate of the thyristor LTT is turned on first, the thyristor LTT is not damaged. Accordingly, by setting the value of the current I2 to satisfy the condition CC>AA+ΔAA, the normal operation can be performed without any problem irrelevant to the presence of the current I2.

The same effect can be attained even if a delay time TD is inserted after the current IT is set at 0, as indicated by I2'. This is because, a sufficient amount of remaining carriers exist in the entire parts of each of the thyristors during the delay time TD. Thus the thyristors will not be damaged even if the thyristor is turned on during the delay time TD.

After the protection period TFP has passed, the current I2 flowing through the switching device S2 is switched off. Accordingly, the forward withstand voltage of each of the thyristors LTTs rapidly recover to the rated forward withstand voltage VDMR.

For example, when the surge voltage VS2 larger than the forward withstand voltage CC is applied to the thyristors LTTs at a time t2 in the period T2 shown in FIG. 3, the thyristors LTTs are turned on firstly at the gate by the current I2. Accordingly, the thyristors LTTs will not be damaged.

Further, the thyristors LTTs are protected from the external surge voltage when the surge voltage VS1 larger than the forward withstand voltage CC is applied to the thyristors LTTs at the time t1 in the period T1. In this case, by driving the switching device S1 to flow the current I1 during the period T1 when the AND condition of the gate pulse instruction signal PHS and the forward voltage signal FV is satisfied, and inputting the first gate power to the thyristors LTTs, the thyristors LTTs can be protected more safely.

When the surge voltage VS3 is applied to the thyristors LTTs at the time t3 in the period T3 that the forward withstand voltage has recovered to the rated voltage level VDRM, the arrester Ar lowers the surge voltage under the rated value VDRM. Accordingly, no specific protection needs to be provided.

During the period TFP, the forward withstand voltage has not sufficiently recovered. However, according to the present invention, when an over-voltage larger than the forward withstand voltage of the thyristor is applied to the thyristor LTT during this period, the thyristor LTT is seemingly broken over, but is protected without any damage.

As described above, according to the present invention, the power converter in which the thyristor LTT is not damaged even if the thyristor LTT is applied with an excess forward voltage during the transient period from the time when the thyristor valve current is cut off to the time when the forward withstand voltage recovers to the rated value VDRM.

The period of time from the time when the thyristor valve current is cut off to the time when the forward withstand voltage of the thyristor depends on a thyristor junction temperature Tj and the thyristor valve current IT. Accordingly, as the amount of the thyristor valve current IT and the junction temperature Tj increase, the recovering period is lengthened. Consequently, when the amount of the thyristor valve current IT and the junction temperature Tj increase, the protection period setting signal is lengthened. Also, when the amount of the thyristor valve current IT and the junction temperature Tj decrease, the protection period setting signal is shortened. By controlling the length of the protection period setting signal in this manner, the thyristor can be protected effectively.

Further, a signal ITS linked with the thyristor valve current IT and a signal Tjs linked with the thyristor junction temperature Tj are input to the pulse generator PG. And then, the output from the pulse generator PG is supplied to the thyristor LTTs. In the logic circuit LG2, the period STEP is varied corresponding to the output from the pulse generation pg. Accordingly, the power converter having more effective protection function can be realized.

As described above, in the power converter according to the present invention, when the thyristor is applied with the excess forward bias voltage larger than the forward withstand voltage of the thyristor during the transient period until the thyristor recovers the forward withstand voltage, the thyristor is turned on firstly at the gate to protect the thyristor from damage. With use of this thyristor valve, an electric current converter with high reliability can be realized.

I claim:

1. A power converter having a thyristor valve which is turned on by being supplied with a gate power to flow a current in one direction, comprising:

trigger pulse generating means for generating a trigger pulse signal to supply to the thyristor valve a first gate power to turn on the thyristor valve;

detecting means for detecting, during a turn a transient period from a time at which the thyristor valve current is cut off to a time at which a withstand voltage of the thyristor valve recovers to a rated value; and supplemental pulse generating means for continuously generating a supplemental pulse signal to supply a second gate power to the thyristor valve during the transient period detected by said detecting means, the second gate power being set at a level lower than that of the first gate power so that the thyristor valve is not turned on.

2. A power converter according to claim 1, wherein the second gate power is set at a level of 1–10% of the first gate power.

3. A power converter according to claim 1, wherein the supplemental pulse generating means generates the supplemental pulse signal such that a period during which the second gate power is supplied to the thyristor valve is longer than a normal turning-on time of the thyristor valve.

4. A power converter according to claim 1, wherein the supplemental pulse generating means sets a period during which the second gate power is supplied to the thyristor valve, on the basis of a reverse voltage signal which represents that a reverse bias voltage is applied to the thyristor valve.

5. A power converter according to claim 1, wherein the trigger pulse generating means for generating the trigger pulse signal hinders the supplemental pulse signal from being generated when the thyristor valve is applied with a forward bias voltage during a predetermined period started from a time when the thyristor valve current is cut off to approximately a turn-off time of the thyristor valve, such that the first gate power is supplied to the thyristor valve.

6. A power converter according to claim 1, wherein the supplemental pulse generating means controls a period during which the second gate power is supplied to a thyristor valve in accordance with at least one of the thyristor valve current and the thyristor junction temperature.

7. A power converter having a thyristor valve which is turned on by being supplied with a gate power to flow a current in one direction, comprising:

trigger pulse generating means for generating a trigger pulse signal to supply to the thyristor valve a first gate power to turn on the thyristor valve; and supplemental pulse generating means for continuously generating a supplemental pulse signal to supply a second gate power lower than the first gate power to the thyristor valve during a predetermined period from a time when the current is cut off, wherein the thyristor valve comprises:

at least one light-triggered thyristor which is supplied with a light-triggered signal as the trigger pulse signal, wherein the trigger pulse generating means includes:

a power source;

a light emitting element connected to the power source; and a first switching element arranged between the power source and the light emitting element, and which is turned on when the first gate power is supplied to the at least one light-triggered thyristor, thereby making the light emitting element output the trigger pulse signal, and wherein the supplemental pulse generating means includes:

a second switching element connected in parallel with the first switching element, and which is turned on when the second gate power is supplied to the at least one light-triggered thyristor, thereby making the light emitting element output a light pulse signal corresponding to the supplemental pulse; and an impedance connected serially to the second switching element, for setting a current which is supplied to the light emitting element when the second switching element is turned on at a lower level than that of a current supplied to the light emitting element when the first switching element is turned on.

8. A power converter having a thyristor valve which is turned on by being supplied with a gate power to flow a current in one direction, comprising:

trigger pulse generating means for generating a trigger pulse signal to supply to the thyristor valve a first gate power to turn on the thyristor valve;

means for detecting a transient period from a time at which the thyristor valve current is cut off to a time at which a withstand voltage of the thyristor valve recovers to a rated value; and supplemental pulse generating means for continuously generating a supplemental pulse signal to supply a second gate power to the thyristor valve during the transient period, the second gate power being set at a level such that the thyristor valve is not turned on, and that a predetermined amount of carriers are present in a gate portion of the thyristor valve during the transient period.

9. A power converter having a thyristor valve, comprising:

a detecting mechanism configured to detect a transient period from a time at which the thyristor valve current is cut off to a time at which a withstand voltage of the thyristor valve recovers to a rated value; and a pulse generator which generates a first trigger pulse signal to supply to the thyristor valve a first gate power to turn on the thyristor valve, and which continuously, during the transient period detected by said detecting mechanism, generates a second pulse signal to supply a second gate power to the thyristor valve, the second gate power being set at a level lower than that of the first gate power so that the thyristor valve is not turned on.

10. A power converter according to claim 9, wherein the second gate power is set at a level of 1–10% of the first gate power.

11. A power converter according to claim 9, wherein the pulse generator generates the supplemental pulse signal such that a period during which the second gate power is supplied to the thyristor valve is no longer than a turn-on time of the thyristor valve.

12. A power converter according to claim 9, wherein the pulse generator sets a period during which the second gate power is supplied to the thyristor valve, on the basis of a reverse voltage signal which represents that a reverse bias voltage is applied to the thyristor valve.

13. A power converter according to claim 9, wherein the thyristor valve comprises:

at least one light-triggered thyristor which is supplied with a light-triggered signal as the trigger pulse signal, first pulse generator which includes:

a power source;
a light emitting element connected to the power source; and
a first switching element arranged between the power source and the light emitting element, and which is turned on when the first gate power is supplied to the light-triggered thyristor, thereby making the light emitting element output the first trigger pulse signal, and a second pulse generator which includes:

a second switching element connected in parallel with the first switching element, and which is turned on when the second gate power is supplied to the light-triggered thyristor, thereby making the light emitting element output a light pulse signal corresponding to the second pulse; and an impedance connected serially to the second switching element, which sets a current which is supplied to the light emitting element when the second switching element is turned on to be a lower level than that of a current supplied to the light emitting element when the first switching element is turned on.

14. A power converter according to claim 9, wherein the pulse generator hinders the second pulse signal from being generated when the thyristor valve is applied with a forward bias voltage during a predetermined period started from a time when the thyristor valve current is cut off to approximately a turn-off time of the thyristor, such that the first gate power is supplied to the thyristor valve.

15. A power converter according to claim 9, wherein the pulse generator controls a period during which the second gate power is supplied to the thyristor valve in accordance with at least one of the thyristor valve current and a thyristor junction temperature.

* * * * *

UNITED STATES PATENT AND TRADEMARK OFFICE
CERTIFICATE OF CORRECTION

PATENT NO. : 5,852,556
DATED : DECEMBER 22, 1998
INVENTOR(S) : Sumio KOBAYASHI

It is certified that error appears in the above-identified patent and that said Letters Patent is hereby corrected as shown below:

In col. 3, at line 48, change "randombly" to --randomly--.

Signed and Sealed this

Third Day of October, 2000

Attest:

Q. TODD DICKINSON

*Attesting Officer*      *Director of Patents and Trademarks*